United States Patent
Aida et al.

(10) Patent No.: US 10,480,096 B2
(45) Date of Patent: *Nov. 19, 2019

(54) DIAMOND SUBSTRATE

(71) Applicant: Adamant Namiki Precision Jewel Co., Ltd., Tokyo (JP)

(72) Inventors: Hideo Aida, Tokyo (JP); Koji Koyama, Tokyo (JP); Kenjiro Ikejiri, Tokyo (JP); Seongwoo Kim, Tokyo (JP)

(73) Assignee: ADAMANT NAMIKI PRECISION JEWEL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/026,342

(22) Filed: Jul. 3, 2018

(65) Prior Publication Data

US 2018/0312993 A1    Nov. 1, 2018

Related U.S. Application Data (62) Division of application No. 15/026,063, filed as application No. PCT/JP2014/075365 on Sep. 25, 2014, now Pat. No. 10,132,000.

(30) Foreign Application Priority Data

Sep. 30, 2013 (JP) ................................. 2013-203784

(51) Int. Cl.
 *B32B 3/00* (2006.01)
 *C30B 25/18* (2006.01)
 (Continued)

(52) U.S. Cl.
 CPC .............. *C30B 25/18* (2013.01); *C23C 16/01* (2013.01); *C23C 16/274* (2013.01);
 (Continued)

(58) Field of Classification Search
 CPC ....... C30B 25/18; C30B 25/105; C30B 29/04; C30B 33/02; C23C 16/01; C23C 16/274
 See application file for complete search history.

(56) References Cited

U.S. PATENT DOCUMENTS

| 5,776,246 A | 7/1998 | Tanabe et al. |
|---|---|---|
| 6,096,129 A | 8/2000 | Saito et al. |
| (Continued) | | |

FOREIGN PATENT DOCUMENTS

| CN | 102345169 | 2/2012 |
|---|---|---|
| EP | 0573943 | 6/1993 |
| (Continued) | | |

OTHER PUBLICATIONS

International Search Report—PCT/JP2014/075365 dated Dec. 9, 2014.
(Continued)

*Primary Examiner* — Elizabeth E Mulvaney
(74) *Attorney, Agent, or Firm* — Cantor Colburn LLP (57) ABSTRACT

A diamond substrate is formed of diamond single crystals by preparing a base substrate; forming plural pillar-shaped diamonds formed of diamond single crystals on one side of the base substrate; causing a diamond single crystal to grow from a tip of each pillar-shaped diamond and coalescing the diamond single crystals growing from the tips of the pillar-shaped diamonds to form a diamond substrate layer; separating the diamond substrate layer from the base substrate; and manufacturing a diamond substrate from the diamond substrate layer, a shape in an in-plane direction of the diamond substrate is a circular shape or a circular shape having an orientation flat plane formed therein and has a diameter of two inches or more.

6 Claims, 10 Drawing Sheets

(51) Int. Cl.
*C30B 29/04* (2006.01)
*C30B 25/10* (2006.01)
*C23C 16/01* (2006.01)
*C23C 16/27* (2006.01)
*C30B 33/02* (2006.01)

(52) U.S. Cl.
CPC ............ *C30B 25/105* (2013.01); *C30B 29/04* (2013.01); *C30B 33/02* (2013.01)

(56) References Cited

U.S. PATENT DOCUMENTS

| | | | |
|---|---|---|---|
| 9,752,255 B2 | 9/2017 | Noguchi et al. | |
| 2006/0266279 A1 | 11/2006 | Mokuno et al. | |
| 2008/0003447 A1 | 1/2008 | Nee | |
| 2011/0315074 A1 | 12/2011 | Noguchi et al. | |

FOREIGN PATENT DOCUMENTS

| | | |
|---|---|---|
| JP | 6247793 | 9/1994 |
| JP | 08133893 | 5/1996 |
| JP | 3387154 | 1/2003 |
| JP | 2003277183 | 10/2003 |
| JP | 2007287771 | 11/2007 |
| JP | 2009525944 | 7/2009 |
| JP | 2012111653 | 6/2012 |
| JP | 5066651 | 8/2012 |
| JP | 2013053050 | 3/2013 |
| JP | 2013053051 | 3/2013 |
| WO | 2015190427 | 12/2015 |

OTHER PUBLICATIONS

Chinese Office Action—Chinese Application No. 201480053428.0 dated Jul. 28, 2017, citing EP 0573943.

Chinese Office Action—Chinese Application No. 201480053428.0 dated Mar. 28, 2018, citing EP 0573943 and CN 102345169.

European Search Report—European Application No. 14848179.9, dated May 19, 2017, citing EP 0 573 943, JP H08 133893 and JP 2013 053051.

Japanese Office Action—Japanese Application No. 2015-539292 dated Nov. 14, 2016, citing JP H08-133893, JP 2003-277183 and WO 2015/190427.

Japanese Office Action—Japanese Application No. 2015-539292 dated Feb. 6, 2017, citing JP 2009-525944, JP H08-133893, JP 2003-277183 and WO 2015/190427.

DIAMOND SUBSTRATE

CROSS-REFERENCE TO RELATED PATENT APPLICATIONS

This application is a divisional application of U.S. application Ser. No. 15/026,063, filed on Mar. 30, 2016, which is a national entry of PCT Application No. PCT/JP2014/075365 filed on Sep. 25, 2014, which claims priority to and the benefit of Japanese Patent Application No. 2013-203784, filed on Sep. 30, 2013, in the Japanese Patent Office, the entire contents of which are incorporated herein by reference.

TECHNICAL FIELD

The present invention relates to a diamond substrate.

BACKGROUND ART

A diamond is expected to be an ultimate semiconductor substrate. This is because a diamond has a lot of excellent characteristics, which are unparalleled in anywhere as a semiconductor material, such as high thermal conductivity, high electron/hole mobility, high dielectric breakdown field strength, low dielectric loss, and a wide bandgap. The bandgap thereof is about 5.5 eV which is a very high value in existing semiconductor materials. Particularly, in recent years, UV light emitting elements using a wide bandgap, field effect transistors having excellent high-frequency characteristics, and the like have been developed.

When it is considered that a diamond is used as a semiconductor, a certain size such as a diameter of several inches is required. This is because when a processing device which is used for micro-machining of a general semiconductor such as Si is applied to a diamond, it is difficult to apply the processing device to a small substrate less than several inches.

Several ideas have been proposed as the method of causing a diamond having a certain size to grow. Among the methods, a diamond single crystal growing method (so-called mosaic growth method; for example, see Patent Literature 1) of arranging plural small diamond single crystal substrates or a manufacturing method (for example, see Patent Literature 2) of using a single-crystal magnesium oxide (MgO) substrate as a base substrate and forming a diamond film on the base substrate by a heteroepitaxial growth method can be used as a strong candidate.

The mosaic growth method is a technique of growing and forming a large diamond single crystal substrate by arranging plural diamond single crystal substrates in a shape of tiles and causing diamond single crystals to newly grow on the diamond single crystal substrates using a homoepitaxial growth method. However, coupling boundaries are formed as areas in which crystal quality deteriorates on the boundaries between the diamond single crystal substrates arranged in the shape of tiles. Accordingly, a coupling boundary is necessarily formed in diamond single crystals obtained using the mosaic growth method.

The reason of formation of the coupling boundary is that diamond single crystals grow randomly in the area of the coupling boundary, coalescence occurs from various directions, and a large amount of potential is generated in the coupling boundary. The coupling boundary is a distinct boundary line which can be observed visually.

Since the part of the coupling boundary cannot be used for growth of a semiconductor device, an area which can be used in practice is limited with respect to the area of the diamond single crystal substrate which is obtained by the mosaic growth method.

To make matters worse, the area of the diamond single crystal substrate which can be used to manufacture a semiconductor device does not match the size of a semiconductor device chip necessarily. Accordingly, in the process of manufacturing a semiconductor device in the diamond single crystal substrate, it is necessary to perform the process to avoid the coupling boundary. As a result, the process of manufacturing a semiconductor device is complicated.

On the other hand, the heteroepitaxial growth method is a technique of causing a diamond film which will be a diamond substrate to epitaxial-grow on a base substrate formed of a material having different physical properties. Since one diamond film epitaxial-grows on one base substrate, there is no concern that a coupling boundary between plural diamond single crystal substrates is formed like the mosaic growth method.

Accordingly, among the two methods of the mosaic growth method and the heteroepitaxial growth method, the heteroepitaxial growth method is particularly prospective in that a substrate area in which a semiconductor device can be manufactured is not easily restricted.

However, a stress is generated in crystals of a diamond substrate formed by growth due to a difference in lattice constant and thermal expansion coefficient between the base substrate and the diamond and thus a warp or a crack is generated in the diamond substrate. Accordingly, it is not easy to obtain a large substrate using the heteroepitaxial growth method.

Therefore, several prior arts relevant to a decrease in stress generated in a diamond formed by the heteroepitaxial growth method have been reported (for example, see Patent Literature 3).

Patent Literature 1: Japanese Patent No. 3387154
Patent Literature 2: Japanese Patent No. 5066651
Patent Literature 3: Japanese Unexamined Patent Application Laid-open No. 2007-287771

DISCLOSURE OF THE INVENTION

Technical Problem

However, although ten years or more passes after the above-mentioned prior arts have been reported, diamond substrates which have been manufactured using the heteroepitaxial growth method have a maximum diameter of 1.5 inches and a substrate of two inches or more which is required for application to semiconductor has not been manufactured yet. In consideration of this point, the prior arts have not basically solved the problem about relaxation of a stress in diamond crystals grown in the heteroepitaxial growth method. That is, a decrease in warp or crack in a diamond substrate of two inches or more has not been realized, and the upper-limit diameter of the diamond substrates having the decreased warp or crack is kept 1.5 inches.

This situation can be theoretically described using Expression 1. Expression 1 indicates that a warp $\delta$ of a diamond substrate increases by a variation of a square of a diameter I with an increase in diameter I of the diamond substrate. Accordingly, with an increase in diameter I of a diamond substrate, a stress $\sigma$ generated in diamond crystals increases. For this reason, the prior arts have a limit in suppressing a stress in diamond crystals and only diamond substrates having a diameter up to about 1.5 inches have been reported as realizable examples. In Expression 1, E denotes a Young's modulus, u denotes a Poisson's ratio, b denotes a thickness of a base substrate, and d denotes a thickness of a diamond substrate.

$$\sigma = \frac{Eb^2\delta}{3(1-v)l^2 d} \quad \text{Expression 1}$$

The present invention is made in consideration of the above-mentioned circumstances and an object thereof is to provide a large diamond substrate with a diameter of two inches or more.

Another object of the present invention is to provide a diamond substrate manufacturing method which can manufacture a large diamond substrate with a diameter of two inches or more Technical Solution The above-mentioned objects are achieved by the following present invention. That is, a diamond substrate according to the present invention is formed of diamond single crystals, and a shape in an in-plane direction of the diamond substrate is a circular shape or a circular shape having an orientation flat plane formed therein and has a diameter of two inches or more.

A diamond substrate manufacturing method according to the present invention includes: preparing a base substrate; forming a plurality of pillar-shaped diamonds formed of diamond single crystals on one side of the base substrate; causing a diamond single crystal to grow from a tip of each pillar-shaped diamond and coalescing the diamond single crystals growing from the tips of the pillar-shaped diamonds to form a diamond substrate layer; separating the diamond substrate layer from the base substrate; and manufacturing a diamond substrate from the diamond substrate layer, wherein a shape in an in-plane direction of the diamond substrate is a circular shape or a circular shape having an orientation flat plane formed therein and has a diameter of two inches or more.

Advantageous Effects

According to the diamond substrate of the present invention, it is possible to realize a large diamond substrate with a diameter of two inches or more which is formed of diamond single crystals.

According to the diamond substrate manufacturing method of the present invention, the diamond single crystals growing from the pillar-shaped diamonds are coalesced to manufacture a diamond substrate layer. Accordingly, by increasing the number of pillar-shaped diamonds, it is possible to easily manufacturing a large-diameter diamond substrate layer with a diameter of two inches or more.

According to the diamond substrate manufacturing method of the present invention, a stress is generated in each pillar-shaped diamond due to a difference in lattice constant and/or a difference in thermal expansion coefficient between the base substrate and the diamond substrate layer when the diamond substrate layer is grown, and the pillar-shaped diamonds are destroyed by the stress to separate the diamond substrate layer from the base substrate.

Accordingly, even when a stress generated in the diamond substrate layer increases with an increase in size, the stress of the diamond substrate layer is released toward the outside by destruction of the pillar-shaped diamonds and thus formation of a crack in the diamond substrate layer is prevented. In this respect, it is also possible to manufacture a large diamond substrate.

By manufacturing the diamond substrate from the diamond substrate layer, it is possible to manufacture a large-diameter diamond substrate with a diameter of two inches or more.

BEST MODE FOR CARRYING OUT THE INVENTION

Hereinafter, a diamond substrate according to the present invention will be described in detail with reference to FIG. 1. The shape in an in-plane direction of the diamond substrate according to the present invention is not particularly limited and may be, for example, a rectangular shape. However, a circular shape can be preferably used from the viewpoint of easy use in manufacturing processes for a surface acoustic wave element, a thermistor, a semiconductor device, and the like. Particularly, as illustrated in FIG. 1, a circular shape having an orientation flat plane formed therein can be preferably used.

Figure 1:
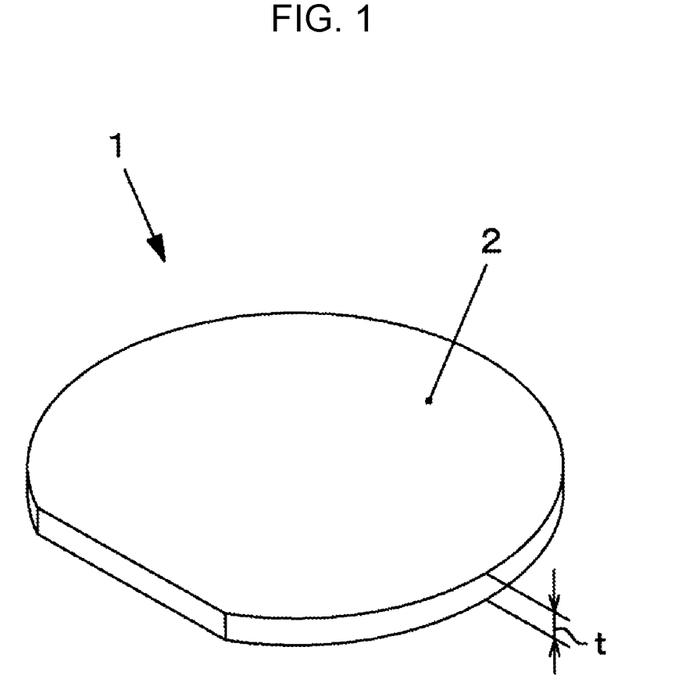
FIG. 1 is a perspective view illustrating an example of a diamond substrate according to an embodiment of the present invention.

When the shape of the diamond substrate 1 is a circular shape or a circular shape having an orientation flat plane formed therein as illustrated in FIG. 1, the diameter is preferably equal to or greater than two inches (about 50.8 mm) from the viewpoint of an increase in size of a practical substrate, more preferably equal to or greater than three inches (about 76.2 mm), and still more preferably equal to or greater than six inches (about 152.4 mm). In consideration of dimensional tolerance of the diamond substrate 1, in this specification, a diameter range of 49.8 mm, which is obtained by subtracting 1.0 mm corresponding to 2% of 50.8 mm from two inches, to 50.8 mm is defined to correspond to two inches.

The upper limit of the diameter is not particularly limited, but is preferably equal to or less than eight inches (about 203.2 mm) in terms of practical use. In order to manufacture a lot of elements or devices at a time, a rectangular diamond substrate having an area equivalent to or greater than the diameter of two inches may be used.

Therefore, the surface 2 of the diamond substrate 1 has at least a surface area of 20 cm². From the viewpoint of an increase in size, the surface preferably has a surface area of 1297 cm² or less.

The thickness t of the diamond substrate 1 can be set arbitrarily, is preferably equal to or less than 3.0 mm in terms of a self-supported substrate, and is more preferably equal to or less than 1.5 mm and still more preferably equal to or less than 1.0 mm, from the viewpoint of use for a manufacturing line of elements or devices. On the other hand, the lower limit of the thickness t is not particularly limited, and is preferably equal to or greater than 0.05 mm and is more preferably equal to or greater than 0.3 mm, from the viewpoint of securing of rigidity of the diamond substrate 1 to prevent generation of a fissure, a fracture, or a crack.

Here, the "self-supported substrate" or "self-support substrate" in the present invention means a substrate having such strength that is not only suitable to maintain its own shape and causes no problem in handling thereof. The thickness t can be preferably set to 0.3 mm or more to have such strength. Since a diamond is a very hard material, the upper limit of the thickness t as a self-supported substrate is preferably equal to or less than 3.0 mm in consideration of easiness in cleavage after elements or devices are formed or the like. In terms of a self-supported substrate which can be most frequently used for elements or devices, the thickness t most preferably ranges from 0.5 mm to 0.7 mm (ranges from 500 μm to 700 μm).

Diamond single crystals can be preferably used as the diamond crystals forming the diamond substrate 1. The diamond single crystals may be any of an Ia type, an IIa type and an IIb type, and the Ia type can be preferably used when the diamond substrate 1 is used as a substrate of a semiconductor device, from the viewpoint of a quantity of crystal defects or distortion, or a magnitude of a full width at half maximum of an X-ray rocking curve. The diamond substrate 1 is formed from a single diamond single crystal and coupling boundaries at which plural diamond single crystals are coupled are not present on the surface 2.

The surface 2 of the diamond substrate 1 is subjected to lapping, polishing, or chemical mechanical polishing (CMP). On the other hand, the back surface of the diamond substrate 1 is subjected to lapping and/or polishing. The surface 2 is processed mainly for obtaining a flat substrate shape and the back surface is processed mainly for obtaining a desired thickness t. Since the surface 2 is desired to have surface roughness Ra enough to form elements or devices, the surface roughness is preferably less than 1 nm and more preferably equal to or less than 0.1 nm at which the surface is flattened at an atomic level. The surface roughness Ra may be measured using a surface roughness measuring instrument.

When the diamond substrate 1 is formed of single crystals, the plane orientation of a crystal plane of the surface 2 may be any one of (111), (110), and (100) and is not limited to these plane orientations. The plane orientation (100) can be preferably used from the viewpoint of formation of elements or devices, growth of diamond single crystals, or the like.

When the diamond substrate 1 is formed from a single diamond single crystal, a coupling boundary at which plural diamond single crystals are coupled is not present on the surface 2 and thus deterioration in crystal quality at a boundary is prevented. Accordingly, when the diamond substrate 1 is formed from a single diamond single crystal, the full width at half maximum (FWHM) of an X-ray rocking curve on the surface 2 (particularly, (100)) can be 300 seconds or less over the entire surface 2.

As described above, in the diamond substrate 1 which is formed from a single diamond single crystal, a full width at half maximum of the X-ray rocking curve can be realized to be 300 seconds or less and it is thus possible to provide a diamond substrate 1 with high quality. In addition, it is possible to manufacture elements or devices with high quality and high efficiency by using the diamond substrate 1.

Figure 2:
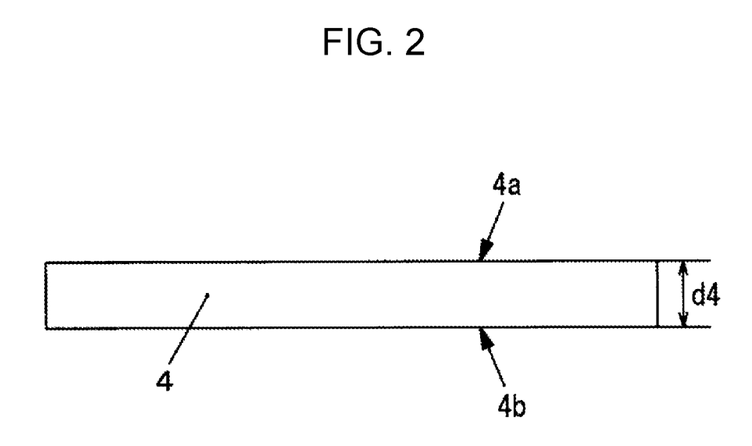
FIG. 2 is a schematic diagram illustrating a base substrate according to the embodiment.

A diamond substrate manufacturing method according to the present invention will be described below in detail with reference to FIGS. 2 to 9. First, a base substrate 4 is prepared as illustrated in FIG. 2. The material of the base substrate 4 is, for example, magnesium oxide (MgO), aluminum oxide (α-Al$_2$O$_3$: sapphire), Si, quartz, platinum, iridium, or strontium titanate (SrTiO$_3$).

Among these materials, particularly, since an MgO single crystal substrate and an aluminum oxide (sapphire) single crystal substrate are very thermally stable and the substrates with a diameter of eight inches (about 203.2 mm) are provided, the MgO single crystal substrate and the aluminum oxide single crystal substrate can be preferably used as a base substrate for growth of a diamond single crystal for the reason of easy availableness.

At least one side 4a of the base substrate 4 is mirror-polished. In a diamond layer growing step to be described later, the diamond layer is grown and formed on the surface (on the surface of the one side 4a) which is subjected to mirror polishing. A base substrate of which one side 4a and a back side 4b are mirror-polished may be used if necessary. In this case, any one surface can be arbitrarily used as a diamond layer growing surface.

The mirror polishing can be performed such that the surface is smoothed to enable a diamond layer to grow on at least the one side 4a, and can be preferably performed such that the surface roughness Ra is equal to or less than 10 nm as a reference. When the surface roughness Ra of the one side 4a is greater than 10 nm, the quality of the diamond layer growing on the one side 4a deteriorates. No crack is present on the one side 4a. The surface roughness Ra can be measured using a surface roughness measuring instrument.

When the MgO single crystal substrate is used as the base substrate 4, the diamond layer growing plane preferably has a plane orientation of (001). Planes other than (001) can also be used.

The shape in the in-plane direction of the base substrate 4 is not particularly limited and may be, for example, a circular shape or a rectangular shape. When the base substrate 4 has a circular shape, the diameter of the base substrate 4 is preferably equal to or greater than two inches (about 50.8 mm) from the viewpoint of an increase in size, more preferably equal to or greater than three inches (about 76.2 mm), and still more preferably equal to or greater than six inches (about 152.4 mm). The upper limit of the diameter is not particularly limited, and is preferably equal to or less than eight inches in terms of practical use. In consideration of dimensional tolerance of the base substrate 4, in this specification, a diameter range of 49.8 mm, which is obtained by subtracting 1.0 mm corresponding to 2% of 50.8 mm from two inches, to 50.8 mm is defined to correspond to two inches.

On the other hand, when the base substrate 4 has a rectangular shape, the size of the base substrate is preferably equal to or greater than 50 mm×50 mm and more preferably equal to or greater than 75 mm×75 mm, from the viewpoint of an increase in size. The upper limit of the size is preferably equal to or less than 200 mm×200 mm in terms of practical use.

Therefore, the surface of the base substrate 4 has at least a surface area of 20 cm$^2$. From the viewpoint of an increase in size, the surface preferably has a surface area of up to 1297 cm$^2$.

The thickness d4 of the base substrate 4 is preferably equal to or less than 3.0 mm, more preferably equal to or less than 1.5 mm, and still more preferably equal to or less than 1.0 mm. The lower limit of the thickness d4 is not particularly limited, but is preferably equal to or greater than 0.05 mm and more preferably equal to or greater than 0.4 mm, from the viewpoint of securing of rigidity of the base substrate 4. When the shape in the in-plane direction of the base substrate 4 is a circular shape and the diameter thereof ranges from 50 mm to 150 mm, the thickness d4 is preferably equal to or greater than 0.3 mm. When the diameter is greater than 150 mm, the thickness d4 is preferably equal to or greater than 0.6 mm.

Figure 3:
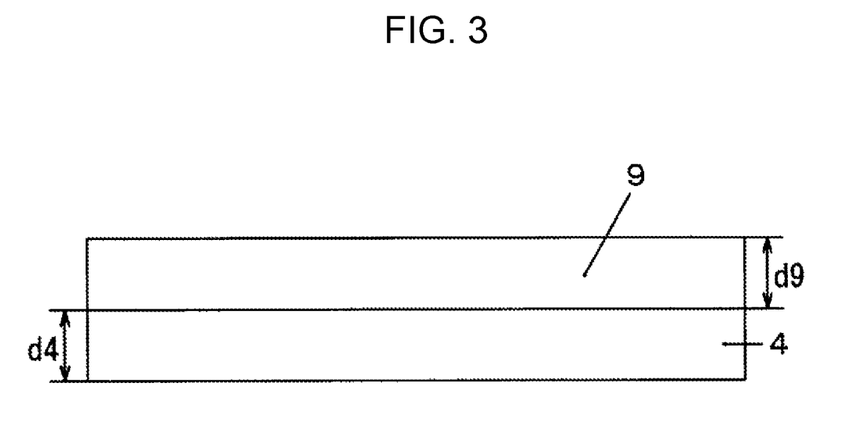
FIG. 3 is a schematic diagram illustrating a state of the base substrate with a diamond layer according to the embodiment.

After the base substrate 4 is prepared, a diamond layer 9 formed of a diamond single crystal is grown and formed on the one side 4a as illustrated in FIG. 3. The method of growing the diamond layer 9 is not particularly limited and a known method can be used. Specific examples of the growth method include vapor phase growth methods such as a pulse laser deposition (PLD) method and a chemical vapor deposition (CVD) method.

The base substrate 4 is subjected to thermal cleaning before the diamond layer 9 grows, and then the diamond layer 9 is made to grow. In the PLD method, laser sputtering is performed on a target containing graphite, amorphous carbon, or diamond in the atmosphere of gas composed substantially of oxygen to cause carbon to fly out of the target and a diamond layer 9 is made to grow on the one side 4a of the base substrate 4. It is preferable that a furnace pressure range from $1.33 \times 10^{-4}$ Pa to 133.32 Pa, the temperature of the base substrate 4 range from 300° C. to 1000° C., and the distance between the target and the base substrate 4 range from 10 mm to 100 mm.

In the CVD method, the base substrate 4 is disposed in a CVD growth furnace and a CVD diamond single crystal is made to grow on the one side 4a of the base substrate 4. A DC plasma method, a hot filament method, a combustion flame method, an arc jet method, or the like can be used as the growth method, and the microwave plasma method can be preferably used to obtain a diamond with high quality in which mixing amount of impurities is small.

In epitaxial growth of the diamond layer 9 using the microwave plasma CVD method, gas containing hydrogen and carbon is used as raw material gas. Methane as the gas containing hydrogen and carbon is introduced into the growth furnace at a methane/hydrogen gas flow rate of 0.001% to 30%. The furnace pressure is kept at about $1.3 \times 10^3$ Pa to $1.3 \times 10^5$ Pa and microwaves of a frequency of 2.45 GHz (±50 MHz) or 915 MHz (±50 MHz) is applied with power of 100 W to 60 kW to generate plasma. Active species are deposited on the one side 4a of which the temperature is kept at 700° C. to 1300° C. by heating of the plasma and CVD diamonds are made to grow.

An iridium (Ir) single crystal film may be formed on the surface of the base substrate 4 as a pre-treatment before the diamond layer 9 grows, and the diamond layer 9 may be made to grow on the Ir single crystal film.

Figure 6:
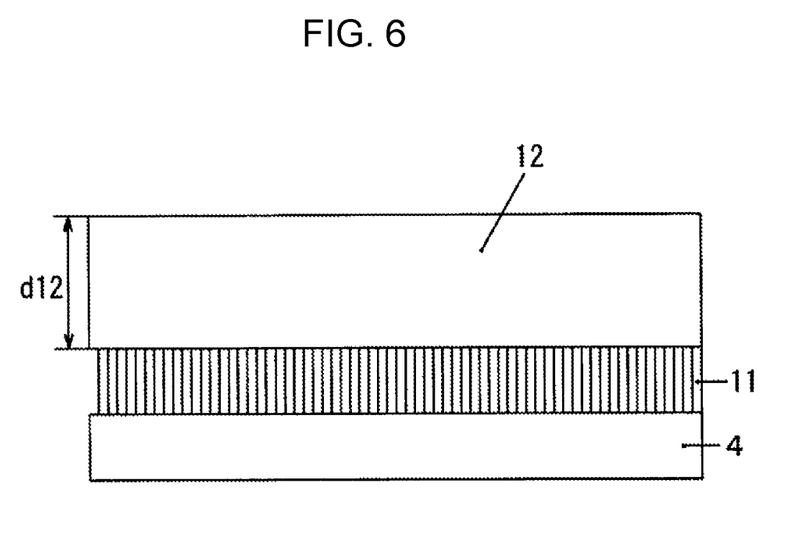
FIG. 6 is a schematic diagram illustrating the base substrate with pillar-shaped diamonds having a diamond substrate layer formed thereon.

The thickness d9 of the diamond layer 9 illustrated in FIG. 6 is set to the height of pillar-shaped diamonds to be formed and is preferably set to a thickness of 30 μm to 500 μm.

Figure 4:
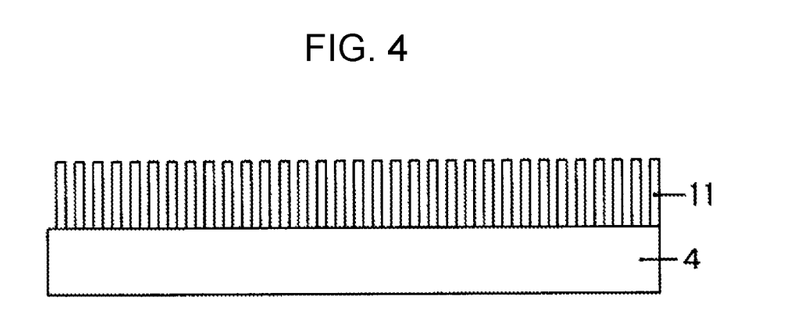
FIG. 4 is a schematic diagram illustrating the base substrate having plural pillar-shaped diamonds formed thereon.
Figure 5:
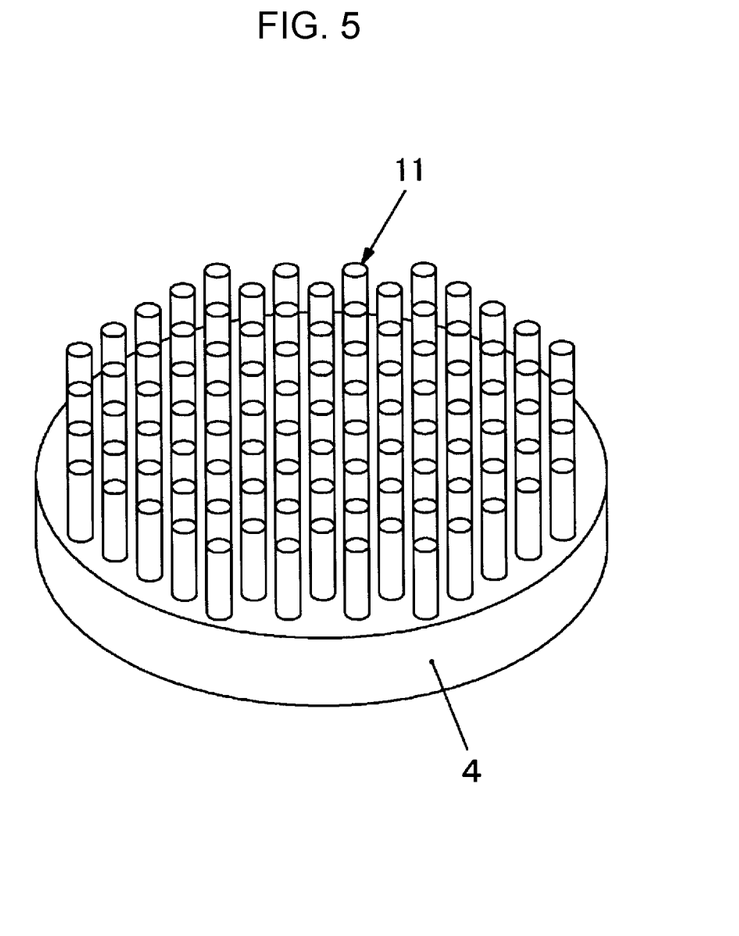
FIG. 5 is a perspective view illustrating the base substrate having plural pillar-shaped diamonds formed thereon.

Plural pillar-shaped diamonds 11 are formed from the diamond layer 9. In the formation, the pillar-shaped diamonds 11 can be formed using etching, photolithography, laser machining, or the like.

Since the diamond layer 9 is formed on the base substrate 4 by heteroepitaxial growth, a lot of crystal defects are formed in the diamond layer 9 but the defects can be thinned out by forming the plural pillar-shaped diamonds 11.

Figure 7:
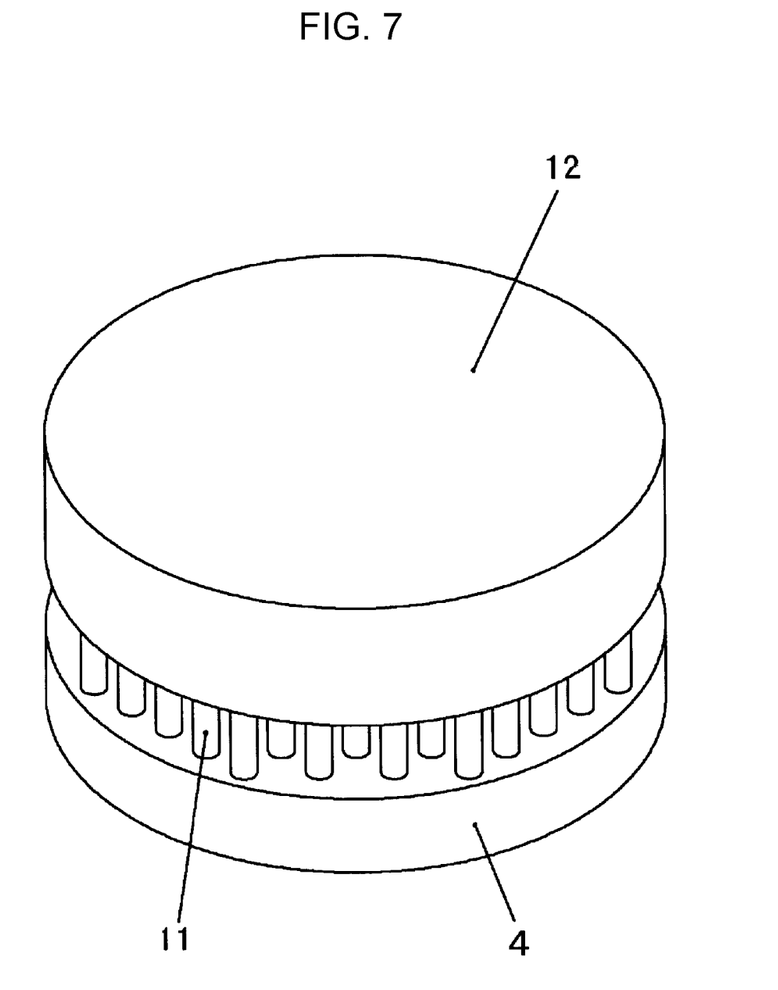
FIG. 7 is a perspective view illustrating the base substrate with pillar-shaped diamonds having a diamond substrate layer formed thereon.

A diamond substrate layer 12 is grown and formed on the tips of the pillar-shaped diamonds 11. By causing a diamond single crystal to grow from the tips of the pillar-shaped diamonds 11, a diamond single crystal can grow uniformly at every pillar-shaped diamond 11. By causing the diamond single crystal to grow in a direction transverse to the height direction of the pillar-shaped diamonds 11, coalescence of the diamond single crystals grown form the pillar-shaped diamonds 11 can be started at the same timing.

The diamond substrate layer 12 is manufactured by coalescing the diamond single crystals grown from the pillar-shaped diamonds 11. The number of pillar-shaped diamonds 11 to be formed varies depending on the diameter of the base substrate 4, and the number of pillar-shaped diamonds 11 can increase with an increase in diameter of the base substrate 4. Accordingly, a diamond substrate layer with a diameter of two inches can be manufactured from a base substrate with a diameter of two inches, and a diamond substrate layer with a diameter of eight inches can be manufactured from a base substrate with a diameter of eight inches.

By setting the pitch of the pillar-shaped diamonds 11 to the same gap (pitch) as growing of cores of the diamond single crystals and growing diamond single crystals from the pillar-shaped diamonds, it is possible to improve the surface quality of the diamond substrate layer 12 and to realize a full width at half maximum of 300 seconds or less on the entire surface.

By setting the diameter and the pitch of the pillar-shaped diamonds 11 to be equal to or less than 10 μm, it is possible to improve the surface quality of the diamond substrate layer 12 and to realize a full width at half maximum of 300 seconds or less.

The pitch of the pillar-shaped diamonds 11 can be appropriately selected. However, the pitch can be properly selected depending on whether the coalescence of the diamond single crystals grown from the pillar-shaped diamonds 11 is started at the same timing.

Figure 8:
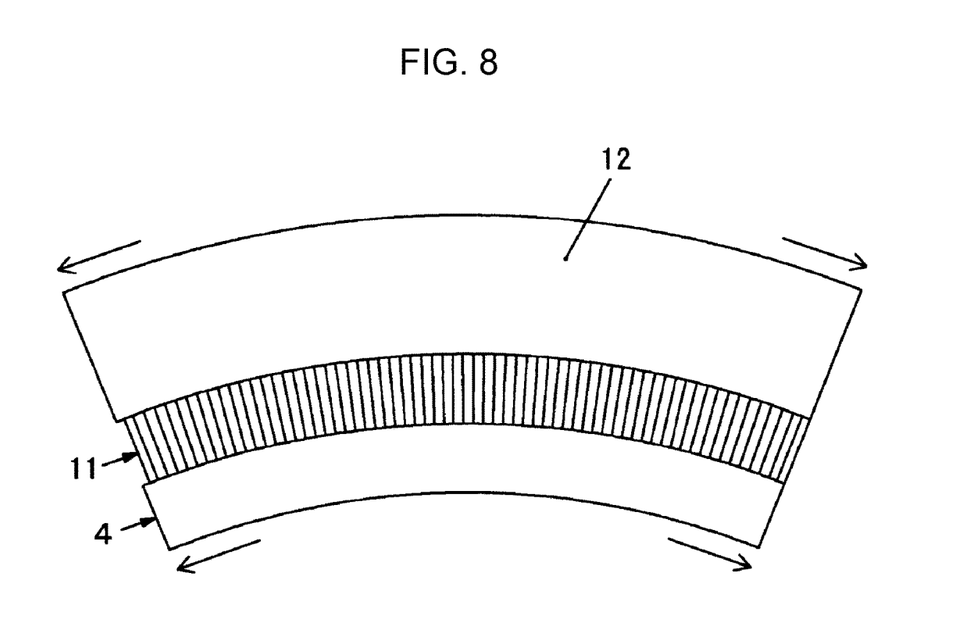
FIG. 8 is a schematic diagram illustrating the diamond substrate layer, the base substrate, and the pillar-shaped diamonds which warp in a convex shape due to a tensile stress.
Figure 9:
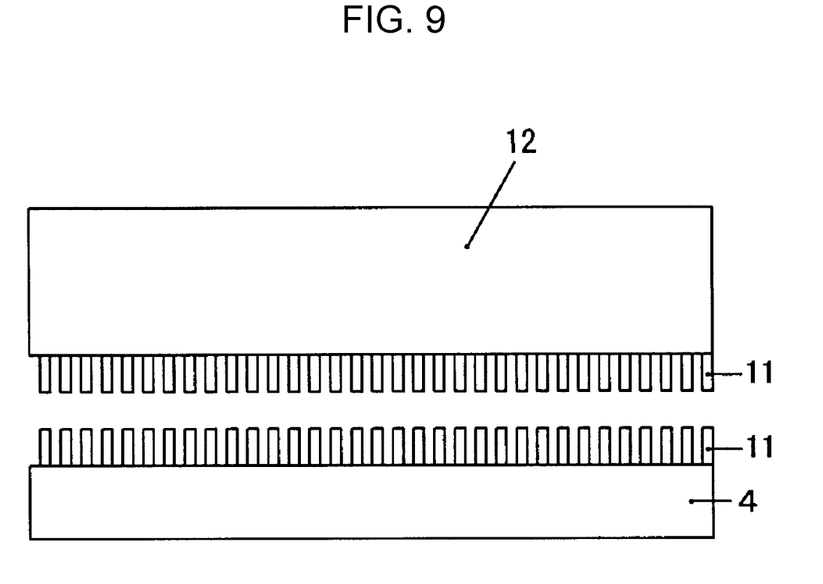
FIG. 9 is a schematic diagram illustrating a state in which the pillar-shaped diamonds are destroyed and the diamond substrate layer is separated from the base substrate.

After the diamond substrate layer 12 is formed, the diamond substrate layer 12 is separated from the base substrate 4 at parts of the pillar-shaped diamonds 11. For the purpose of separation at the pillar-shaped diamonds 11, a certain force needs to be applied to the parts of the pillar-shaped diamonds 11. In the present invention, in growing of the diamond substrate layer 12, a stress is generated in the pillar-shaped diamonds 11 by a warp generated in the base substrate 4 and the diamond substrate layer 12, the pillar-shaped diamonds 11 are destroyed due to the stress, and the diamond substrate layer 12 is separated from the base substrate 4.

For example, as illustrated in FIG. 8, the base substrate 4 formed of MgO single crystals has a thermal expansion coefficient and a lattice constant larger than those of the diamond substrate layer 12 formed of diamond single crystals. Accordingly, in cooling the diamond substrate layer 12 after growth, a tensile stress is generated as indicated by an arrow from the center to the ends on the diamond substrate layer 12 side. The tensile stress is a stress which is generated due to a difference in lattice constant between the base substrate 4 and the diamond substrate layer 12 and/or a stress which is generated due to a difference in thermal expansion coefficient between the base substrate 4 and the diamond substrate layer 12. As a result, all of the diamond substrate layer 12, the base substrate 4, and the pillar-shaped diamonds 11 warp greatly such that the diamond substrate layer 12 side is convex as illustrated in FIG. 8.

A large tensile stress is applied to the pillar-shaped diamonds 11 and a crack is formed in the pillar-shaped diamonds 11. As the crack is progressed, the pillar-shaped diamonds 11 are destroyed as illustrated in FIG. 9 and the diamond substrate layer 12 is separated from the base substrate 4.

Even when the stress generated in the diamond substrate layer 12 increases with an increase in size of the diamond substrate layer 12, the stress of the diamond substrate layer 12 is released to the outside by the destruction of the pillar-shaped diamonds 11. Accordingly, it is possible to prevent a crack from being generated in the diamond substrate layer 12 and thus to manufacture a large diamond substrate 1.

By using the stress which is generated due to a difference in lattice constant between the base substrate 4 and the diamond substrate layer 12 and/or the stress which is generated due to a difference in thermal expansion coefficient between the base substrate 4 and the diamond substrate layer 12 for the separation, a device, a mechanism, or a step for separation is not particularly necessary after the diamond substrate layer 12 grows. Accordingly, it is possible to simplify the process of manufacturing the diamond substrate 1 and to facilitate the separation step.

It is desired that the height direction of each pillar-shaped diamond 11 is set to a direction perpendicular to (001) plane of the diamond single crystal forming the diamond layer 9 and the pillar-shaped diamond 11 because destruction of the pillar-shaped diamonds 11 due to application of a stress can smoothly progress.

Figure 10:
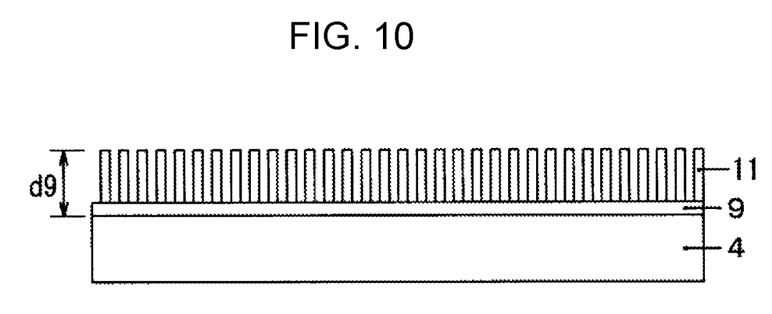
FIG. 10 is a schematic diagram illustrating another example of the base substrate having plural pillar-shaped diamonds formed thereon.

The thickness d9 of the diamond layer 9 illustrated in FIG. 6 is set to the height of the pillar-shaped diamonds to be formed and is preferably set to a thickness of 30 μm to 500 μm. As illustrated in FIG. 10, the pillar-shaped diamonds 11 may be formed in a state in which a part of the diamond layer 9 corresponding to a partial thickness of the lower part of the thickness d9 remains.

The aspect ratio of the pillar-shaped diamonds 11 in FIGS. 4 to 10 can be set to a value at which the pillar-shaped diamonds 11 are not filled fully in growing of the diamond substrate layer 12 and is preferably set to 5 or more.

The cross-sectional shape of the pillar-shaped diamonds 11 may be a rectangular shape or a circular shape. However, the pillar-shaped diamonds 11 need to be rapidly destroyed with application of a stress. In consideration of the above-mentioned description, the cross-sectional shape of the pillar-shaped diamonds 11 is preferably a circular shape (that is, each pillar-shaped diamond 11 is a cylindrical shape), because the stress is uniformly applied in the circumferential direction to uniformly destroy the pillar-shaped diamonds 11. Accordingly, since generation of a fissure, a fracture, a crack, or the like in the diamond substrate layer 12 due to non-uniform destruction can be prevented, the circular shape can be more preferably used.

The diameter of each pillar-shaped diamond 11 is preferably set to submicron to about 5 μm and the diameter of the central portion of each pillar-shaped diamond in the height direction is preferably formed to be smaller than the diameter of the tip portion thereof, because the pillar-shaped diamond 11 can be more easily and smoothly destroyed.

After the diamond substrate layer 12 is separated from the base substrate 4, the diamond substrate layer 12 is polished to remove the remaining pillar-shaped diamonds 11 and a disk is cut out by slicing and circular punching. By performing various processes such as lapping, polishing, and CMP and mirror polishing if necessary on the disk, the diamond substrate 1 is manufactured from the diamond substrate layer 12. Accordingly, the thickness d12 of the diamond substrate layer 12 is set to be slightly larger than the thickness t in consideration of a polishing margin. Since the diamond is a material having highest hardness, the polishing margin is preferably set to be as small as possible from the viewpoint of difficulty in polishing, and can be set to, for example, 50 μm.

By manufacturing the diamond substrate 1 from the diamond substrate layer 12, it is possible to manufacture a large-diameter diamond substrate with a diameter of two inches or more. Since the full width at half maximum of the X-ray rocking curve on the surface 2 of the diamond substrate 1 can be realized to be 300 seconds or less over the entire surface 2, it is possible to provide a diamond substrate 1 with high quality.

EXPLANATION ON REFERENCE NUMERALS

1: diamond substrate
2: surface of diamond substrate
4: base substrate
4a: one side of base substrate
4b: back side of base substrate
9: diamond layer
11: pillar-shaped diamond
12: diamond substrate layer
t: thickness of diamond substrate
d4: thickness of base substrate
d9: thickness of diamond layer
d12: thickness of diamond substrate layer

The invention claimed is:
1. A diamond substrate,
   wherein the diamond substrate consists of diamond single crystals, and is a self-supported substrate,
   a shape in an in-plane direction of the diamond substrate is a circular shape or a circular shape having an orientation flat plane formed therein and has a diameter ranging from two inches to eight inches, and
   a full width at half maximum of an X-ray rocking curve on a surface of the diamond substrate is equal to or less than 300 seconds over the entire surface.
2. The diamond substrate according to any one of claim 1, wherein surface roughness Ra of the surface of the diamond substrate is less than 1 nm.
3. The diamond substrate according to claim 2, wherein the surface roughness Ra is equal to or less than 0.1 nm.
4. The diamond substrate according to any one of claim 1, wherein a thickness of the diamond substrate ranges from 0.05 mm to 3.0 mm.
5. The diamond substrate according to claim 4, wherein the thickness ranges from 0.3 mm to 3.0 mm.

6. The diamond substrate according to claim 4, wherein the thickness of the diamond substrate ranges from 0.5 mm to 0.7 mm.

* * * * *